(12) United States Patent
Li et al.

(10) Patent No.: US 10,938,164 B2
(45) Date of Patent: Mar. 2, 2021

(54) PRIMARY PLUGIN, DRAWER AND DISTRIBUTION PANEL FOR POWER DISTRIBUTION SYSTEM

(71) Applicant: Schneider Electric Industries SAS, Rueil Malmaison (FR)

(72) Inventors: Huaying Li, Shanghai (CN); Michel Abadie, Eybens (FR); Shunyao Wang, Shanghai (CN)

(73) Assignee: Schneider Electric Industries SAS, Rueil Malmaison (FR)

( * ) Notice: Subject to any disclaimer, the term of this patent is extended or adjusted under 35 U.S.C. 154(b) by 53 days.

(21) Appl. No.: 16/437,109

(22) Filed: Jun. 11, 2019

(65) Prior Publication Data

US 2019/0379167 A1 Dec. 12, 2019

(30) Foreign Application Priority Data

Jun. 11, 2018 (CN) .......................... 201820930778.6

(51) Int. Cl.
| | | |
|---|---|---|
| *G06F 1/16* | (2006.01) | |
| *H01R 13/66* | (2006.01) | |
| *H01R 13/502* | (2006.01) | |
| *H01R 25/00* | (2006.01) | |

(52) U.S. Cl.
CPC ........... *H01R 13/6683* (2013.01); *G06F 1/16* (2013.01); *H01R 13/502* (2013.01); *H01R 25/006* (2013.01)

(58) Field of Classification Search
CPC .......................... H01R 13/6683; H01R 13/502; H01R 25/006; Y10S 439/913; G06F 1/16
See application file for complete search history.

(56) References Cited

U.S. PATENT DOCUMENTS

| | | | | |
|---|---|---|---|---|
| 2011/0237125 A1* | 9/2011 | Montena | .............. | G01R 31/343 439/578 |
| 2011/0256767 A1* | 10/2011 | Malstrom | .............. | H01R 24/64 439/620.01 |

FOREIGN PATENT DOCUMENTS

| | | |
|---|---|---|
| CN | 201750085 U | 2/2011 |
| CN | 202423769 U | 9/2012 |
| CN | 107394656 A | 11/2017 |

OTHER PUBLICATIONS

Extended European Search Report for Application No. 19305743. 7-1202 dated Aug. 5, 2019, 7 pages.

* cited by examiner

*Primary Examiner* — Tho D Ta
(74) *Attorney, Agent, or Firm* — Locke Lord LLP (57) ABSTRACT

Embodiments of the present disclosure relate to a primary plugin, a drawer and a distribution panel for a power distribution system. A primary plugin for a power distribution system is provided, the primary plugin comprising: a body; a socket assembly mounted on the body; a measuring unit mounted around the socket assembly and configured to measure electrical parameters in the power distribution system; and a data processing unit mounted on the body and coupled to the measuring unit, the data processing unit being adapted to receive and process the electrical parameters measured by the measuring unit and to upload the processed electrical parameters to a gateway.

9 Claims, 6 Drawing Sheets

PRIMARY PLUGIN, DRAWER AND DISTRIBUTION PANEL FOR POWER DISTRIBUTION SYSTEM

FIELD

Embodiments of the present disclosure relate to power distribution, and more specifically, to a primary plugin for a power distribution system and a drawer and a distribution panel including the same.

BACKGROUND

At present, distribution systems, for example, for intelligent buildings, involve an intelligent distribution solution. The current intelligent distribution solution usually requires intelligent components to realize interconnections, thereby fulfilling corresponding functions of the power distribution system, giving rise to following issues.

For example, it is required to utilize components, like release (NSX) etc. However, the NSX must be used in cooperation with communication interface modules to realize corresponding functions. Drawers or distribution panels, which have been assembled and put into use, must replace components and corresponding cables therein to upgrade into the intelligent distribution solution. This not only prolongs the time for improving the system, but also increases the costs.

As another example, traditional measuring mechanisms (CT) employed in the drawers of the distribution panel occupy a large space. The space for mounting devices or apparatuses with measuring feature is extremely limited in the drawers, especially for the small-sized ones. Therefore, the number of electrical parameters of electrical devices in the power distribution system, which can be measured by the current drawer, is also limited due to the restricted inner space of the drawer.

Therefore, an improved primary plugin for use in a power distribution system is needed, which at least can provide a solution for restricted space of the drawer.

SUMMARY

Embodiments of the present disclosure provide an improved primary plugin for a power distribution system to solve the above mentioned problems.

In an aspect of the present disclosure, a primary plugin for a power distribution system is provided. The primary plugin comprises: a body; a socket assembly mounted on the body; a measuring unit mounted around the socket assembly and configured to measure electrical parameters in the power distribution system; and a data processing unit mounted on the body and coupled to the measuring unit, the data processing unit being adapted to receive and process the electrical parameters measured by the measuring unit and to upload the processed electrical parameters to a gateway.

In accordance with embodiments of the present disclosure, the primary plugin for the power distribution system is intelligent and able to facilitate field upgrading effectively and efficiently. It is also possible to measure, process and transmit various electrical parameters based upon special requirements of the users. By integrating the measuring units with a single primary plugin, embodiments of the present disclosure at least in part solve the problem that the traditional measuring mechanisms occupy large space and thus cannot simultaneously measure and process the various electrical parameters.

In some embodiments, the measuring unit may be selected from a group consisting of: a voltage measuring device for measuring voltages of electrical devices in the power distribution system; a sensor for measuring currents of the electrical devices; a sensor for measuring a temperature of the primary plugin; a sensor for measuring vibration of an environment where the electrical devices are located; and a sensor for measuring humidity of the environment where the electrical devices are located.

In some embodiments, the voltage measuring device may include a stud formed on one side of the body and protruded outward, and a wiring terminal arranged around the stud, wherein the stud is coupled to the socket assembly via a nut.

In some embodiments, the measuring unit is a current sensor arranged on the socket assembly for measuring currents of electrical devices in the power distribution system.

In some embodiments, the data processing unit is detachably mounted on the body by means of mounting structures formed on the body.

In some embodiments, the primary plugin also comprises a shroud arranged above the data processing unit to enclose the data processing unit, wherein a mounting hole is formed in the shroud, and the mounting hole cooperates with one of the mounting structures to detachably mount the shroud on the body.

Another aspect of the present disclosure provides a drawer for a power distribution system including the primary plugin according to any one of the above embodiments.

In some embodiments, the drawer comprises two or three primary plugins, wherein one primary plugin is a master plugin and the rest primary plugins are secondary plugins, wherein the master plugin and the secondary plugins are arranged in the drawer by superimposing one another, and wherein the data processing units of the two or three primary plugins are coupled to each other.

In some embodiments, the data processing units of the two or three primary plugins are coupled with each other via a cable.

A further aspect of the present disclosure provides a distribution panel for a power distribution system comprising the primary plugin and the drawer described above.

In some embodiments, a first end of the socket assembly is of a forked structure, two opposite distal ends of the forked structure extend away from each other, and two opposite side arms of the socket assembly are tapered along a direction from a second end to the first end of the socket assembly, thereby forming a clamping force that couples the primary plugin to the distribution panel via the socket assembly.

BRIEF DESCRIPTION OF THE DRAWINGS

Through the following detailed description with reference to the accompanying drawings not drawn to scale, the above and other objectives, features, and advantages of embodiments of the present disclosure will be understood more easily. Embodiments of the present disclosure will be illustrated by way of example but not limitation in the drawings, in which.

DETAILED DESCRIPTION OF EMBODIMENTS

Concepts and configurations of the present disclosure are now explained with reference to various example embodiments shown in the drawings. The orientation-related terminologies used for depicting corresponding embodiments or examples with reference to the drawings are intended for easily understanding the description of the present disclosure. For example, "up," "down," "vertical," "horizontal (traverse)," "top," "external" and the like depend on either orientations presented when readers look at the drawings or orientations of the products in normal use, and would not restrict the protection scope of the present disclosure in an unexpected way.

As mentioned above, traditional CTs usually occupy relatively large space in drawers of distribution panels of current power distribution systems, and this is particularly unfavorable to small-sized drawers. As the space for mounting devices or apparatuses with measuring feature is extremely limited in the drawers, electrical parameters of electrical devices in the power distribution systems, which can be measured by the drawers, are also restricted. Conventionally, only the electrical parameters such as currents, voltages and the like of the electrical devices in the power distribution systems can be measured.

If it is desired to additionally measure other parameters, such as vibration, humidity, pressure and the like, of the environment where the electrical device is located, it is necessarily needed to provide measuring devices for implementing the corresponding measurement functions. However, it is difficult to set up these measuring devices in the drawers with the current configurations on the account of limited inner space of the drawer. Moreover, even if a limited number of measuring devices can be added, it is impossible to transfer the measured data via the existing gateway to the cloud storage, for example.

Embodiments of the present disclosure propose an improved intelligent primary plugin. In aid of one or more measuring units integrated with the primary plugin and a data processing unit, which is coupled to the measuring units and is capable of collecting, processing and transferring data, the primary plugin as disclosed herein solves the problem that the inner space of the drawers in the traditional distribution panel is insufficient for configuring the measuring mechanisms satisfied by users and for implementing subsequent data processing and transmission.

In accordance with embodiments of the present disclosure, the primary plugin can implement not only traditional functions such as measuring voltage, current and the like of electrical devices, but also measurement of the temperature of the primary plugin per se. The communication device of the primary plugin can transmit the measurements to devices such as a gateway, in a wired or wireless manner, for storage and subsequent processing. The measurement can then be further uploaded to local management software or cloud.

Figure 1:
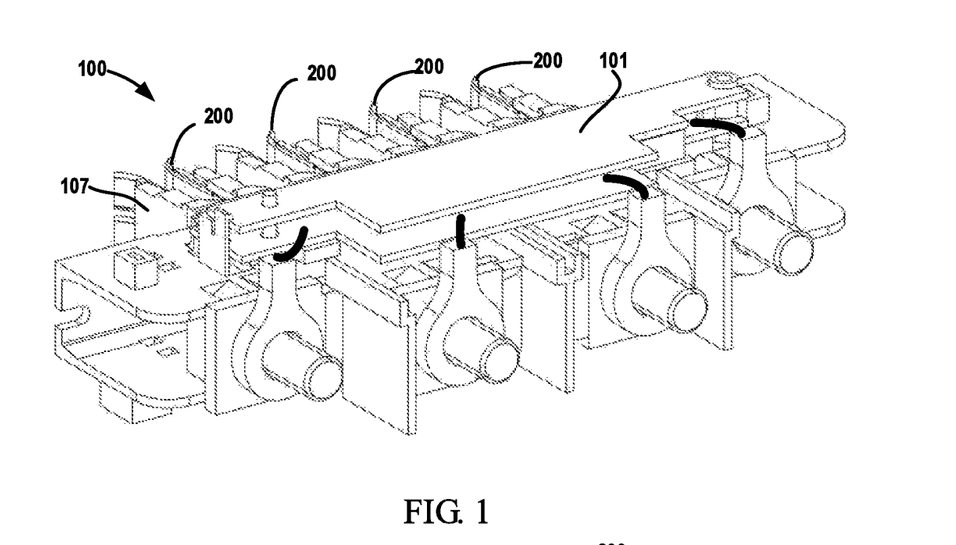
FIG. 1 schematically illustrates a perspective view of a primary plugin for a power distribution system in accordance with embodiments of the present disclosure.

FIG. 1 illustrates a primary plugin 100 in accordance with example embodiments of the present disclosure. Here, by way of example, a three-phase quadrupole primary plugin 100 including four socket assemblies 200 are demonstrated. It is to be understood that it is possible for the primary plugin 100 to contain only one socket assembly 200 as single-phase unipolar type. Therefore, unless explicitly indicated otherwise, the scope of the present disclosure is not limited to the number of related primary plugins in the configurations as shown in any figures.

A cavity is formed within the body 104 of the primary plugin for detachably mounting the socket assembly 200 onto the body 104. The four socket assemblies 200 in the drawings are equidistantly mounted within the body 104, or the body 104 can be specifically implemented, for example, in the form of frame or housing mainly for bearing respective parts of the primary plugin 100.

Figure 5A:
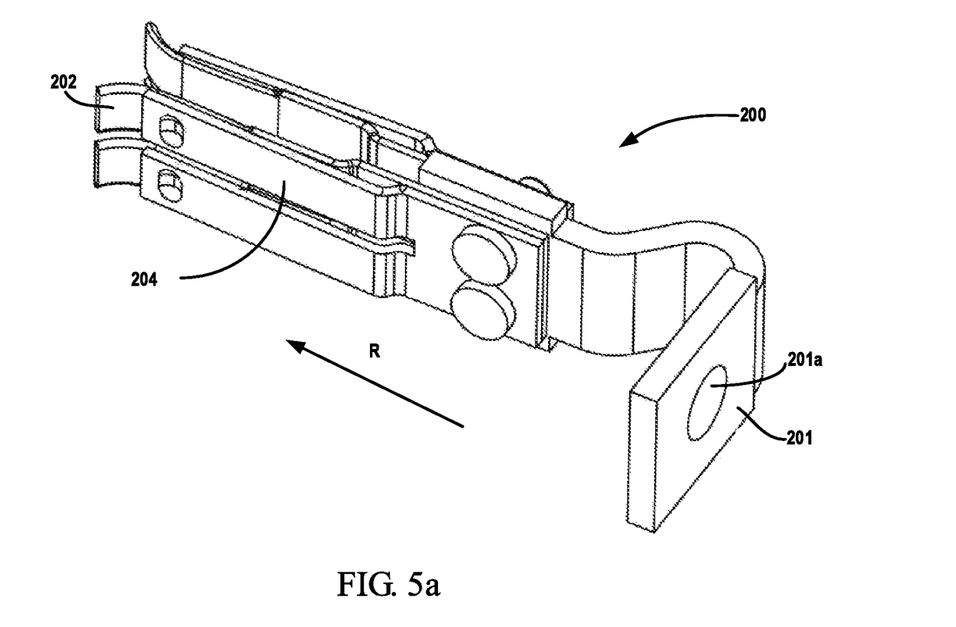
FIGS. 5a and 5b schematically illustrate, from different angle of views, perspective views of a socket assembly of the primary plugin in accordance with embodiments of the present disclosure.
Figure 5B:
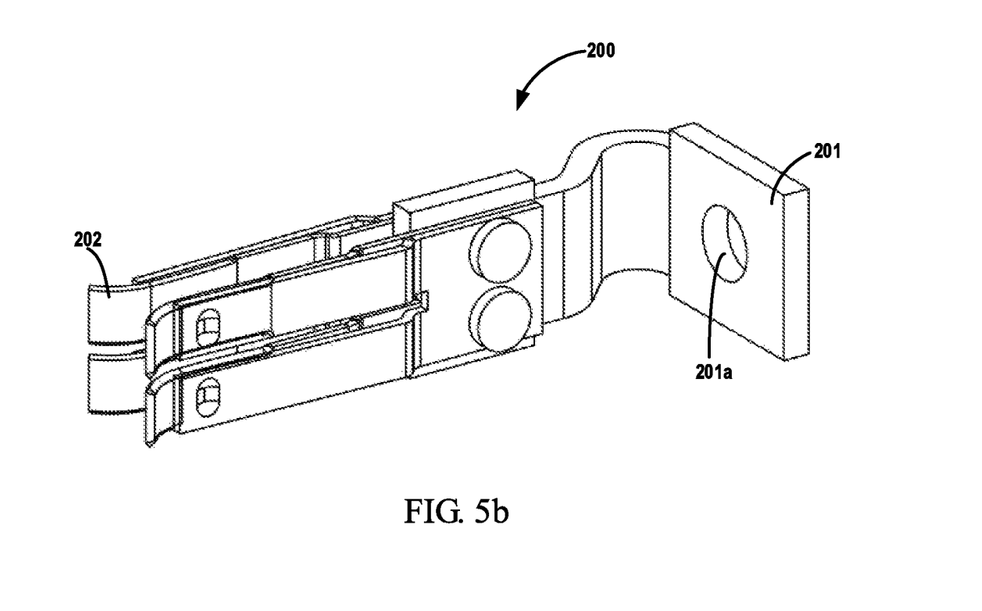

FIGS. 5a and 5b schematically illustrate the socket assembly 200. The socket assembly 200 includes a first end 202 and a second end 201 disposed opposite to each other and two side arms 204 arranged between the first and second ends. In one example, the first end 202 of the socket assembly 200 is forked while the second end 201 is in plate-like or planar form.

When the socket assembly 200 is mounted in the body 104, the first and second ends 202 and 201 protrude outside two opposite sides of the body 104, respectively. One side is formed with a protruded wall 107 (FIG. 1) and the opposite other side is formed with a stud 106. The stud 106 is coupled, via a nut 106a (FIG. 3), to an external conductor arranged outside the primary plugin 100. When the stud 106 is connected to the external conductor via the nut 106a, the coupling between the socket assembly 200 and the external conductor is completed. As an example, the external conductor can be a conducting bar or a cable connector.

The protruded wall 107 is integrally formed with the body 104 through any suitable manners (such as injection, molding and the like), for example. In the above mounting state, the first end 202 of each socket assembly 200 is disposed between two protruded walls 107. At least a part of each side arm 204 abuts against an inner surface of the protruded wall 107.

Figure 2:
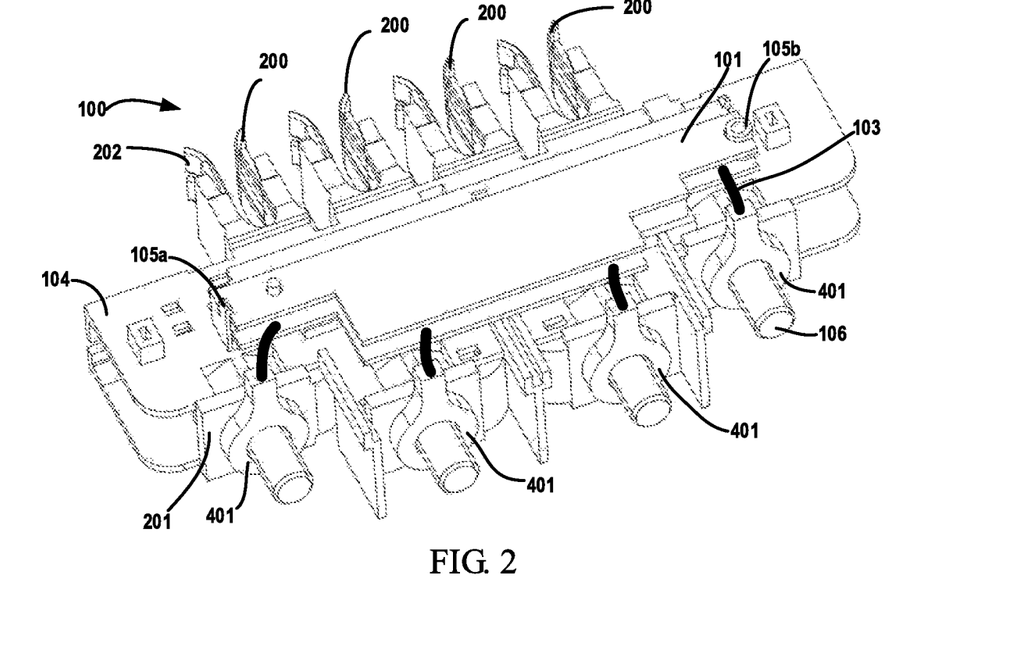
FIG. 2 schematically illustrates a perspective view of a primary plugin in accordance with embodiments of the present disclosure.

A data processing unit 101 of the primary plugin 100 is arranged and substantially centered on outer surface of the body 104. As shown in FIG. 2, the outer surface is a top surface of the body 104. In addition, FIG. 2 also illustrates mounting structures 105a and 105b formed on the body 104. Similar mounting structures also may be formed integrally with the body 104.

The data processing unit 101 can be detachably mounted on the body 104 via the mounting structures 105a and 105b. The mounting structure 105a shown in the drawings is an upright locking piece with a folded edge on its end, while the mounting structure 105b is a column-shaped piece. The above mounting structures can each be fitted with a groove and a notch formed on two opposite edges of the data processing unit 101, so as to stably mount the data processing unit 101 on the body 104. The specific forms of the mounting structures 105a and 105b are not restricted to the examples described herein, and any other suitable and feasible configurations can be provided for detachably assembling the data processing unit 101 with the body 104.

In some embodiments, the data processing unit 101 can be implemented, for example, as Printed Circuit Board Assembly (PCBA) which is integrated with functions of receiving electrical parameters measured by the measuring unit, processing the electrical parameters, and transmitting the processed electrical parameters to another device such as a gateway via wired or wireless communications, for example.

Figure 6:
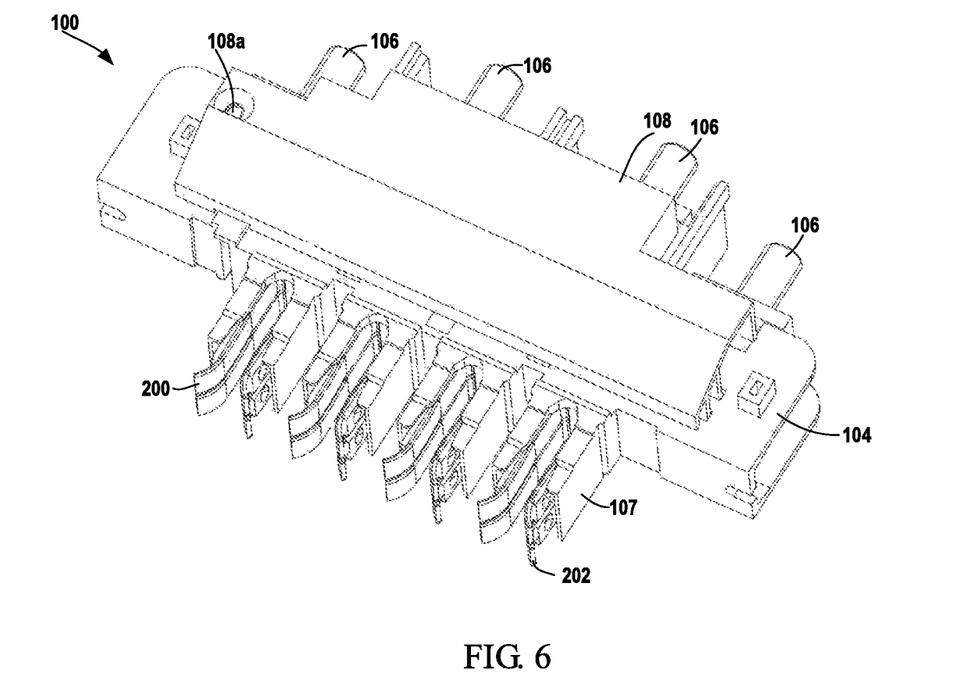
FIG. 6 schematically illustrates a perspective view of a plugin (with shroud shown) in accordance with embodiments of the present disclosure.

In a further embodiment shown in FIG. 6, the primary plugin 100 may further comprise a shroud 108 on which a mounting hole 108a is formed. The shroud 108 is arranged above the data processing unit 101 to enclose the data processing unit 101, for example. The mounting hole 108a may cooperate with one of the mounting structures (e.g., the column-shaped piece 105b shown in FIG. 2) to mount the shroud 108 onto the body 104. For example, fasteners like bolts can pass through the mounting hole 108a and the column-shaped piece 105b to secure the shroud 108. The shroud 108 can prevent dust, gas and liquid (water etc.) from contacting the data processing unit 101 to effectively isolate and protect the data processing unit 101.

In some embodiments, a single primary plugin 100 can carry out measurements of various user-concerned electrical parameters such as voltage, current, temperature, humidity, vibration, pressure and the like in the power distribution systems. Therefore, there is no need to configure various measuring units of relatively greater size within the limited drawer space to measure different electrical parameters. The disadvantage that the traditional measuring units occupy a large space can be overcome by the integrated primary plugin according to embodiments of the present disclosure, which is particularly beneficial to small-sized drawers.

More specifically, the primary plugin 100 in accordance with embodiments of the present disclosure can implement field upgrading and rapid upgrading of drawers and thus distribution panels. Besides, as the data processing unit 101 per se of the primary plugin 100 has data processing and transmission functions, the data processing unit can transmit data, for example, via wireless network protocols, which spares the demand on wirings for carrying out data transmission. Measurements of various combinations of electrical parameters of the power distribution systems and subsequent data processing and wireless transmissions can be implemented according to particular needs of the users, only by replacing the existing plugin in the drawer with the integrated primary plugin 100 having corresponding measuring, data processing and wireless transmission functions.

It is to be understood that in addition to the above mentioned wireless transmission manners, measurements, which are collected and processed by the data processing unit of the primary plugin, also can be transmitted in a wired manner, for example, to the gateway and further uploaded into the local management software or cloud storage, in accordance with some embodiments of the present disclosure.

In some embodiments, the measuring units integrated in the primary plugin 100 may be one or more of: a voltage measuring device for measuring voltages of electrical devices in the power distribution system; a sensor for measuring currents of the electrical devices; a sensor for measuring the temperature of the primary plugin; a sensor for measuring vibration of an environment where the electrical devices are located; and a sensor for measuring humidity of the environment where the electrical devices are located.

It is to be understood that the types of the measuring units that can be provided in the primary plugin 100 are not restricted to the types, structures or configurations as described herein. Depending on the user requirements, any types, structures or configurations of the measuring units can be used, either currently known or to be developed in the future.

In embodiments shown in FIGS. 1 to 4, one example of the measuring units in use is a voltage measuring device. The voltage measuring device mainly includes a wiring terminal (also known as "cable lug") 401 and the stud 106 for measuring, for example, voltage of electrical devices in the power distribution systems. The four wiring terminals 401 shown are respectively coupled to the data processing unit 101 by means of the cable 103, so as to implement coupling between the voltage measuring device and the data processing unit 101.

The stud 106 in the conventional primary plugin is generally used for connecting with the external conductor. However, in some embodiments, the voltage in the power distribution systems, for example, can be measured by mounting the wiring terminal 401 around the stud 106 with the aid of coupling between the wiring terminal 401 and the data processing unit 101. The measurements are transmitted to the data processing unit 101 for subsequent processing.

In the assembled state, the four socket assemblies 200 shown are mounted, respectively, around one stud 106 of the body 104, via a through-hole 201a (FIGS. 5a and 5b). The through-hole 201a is formed substantially at a central position of the second end 201 of the socket assembly 200, for example. Besides, the wiring terminal 401 is also arranged around one stud 106 and can be abut against at least a part of the outer surface of the second end 201.

Results of voltage parameters measured by the voltage measuring device can be transmitted, for example via the cable 103, to the data processing unit 101. The data processing unit 101 then performs data processing for the received measurements of voltage parameters, and subsequently uploads the processed measurements to the gateway in a wired or wireless manner. The measurements also can be further uploaded into local management software or cloud storage, e.g., for monitoring and management over the power distribution systems.

Figure 3:
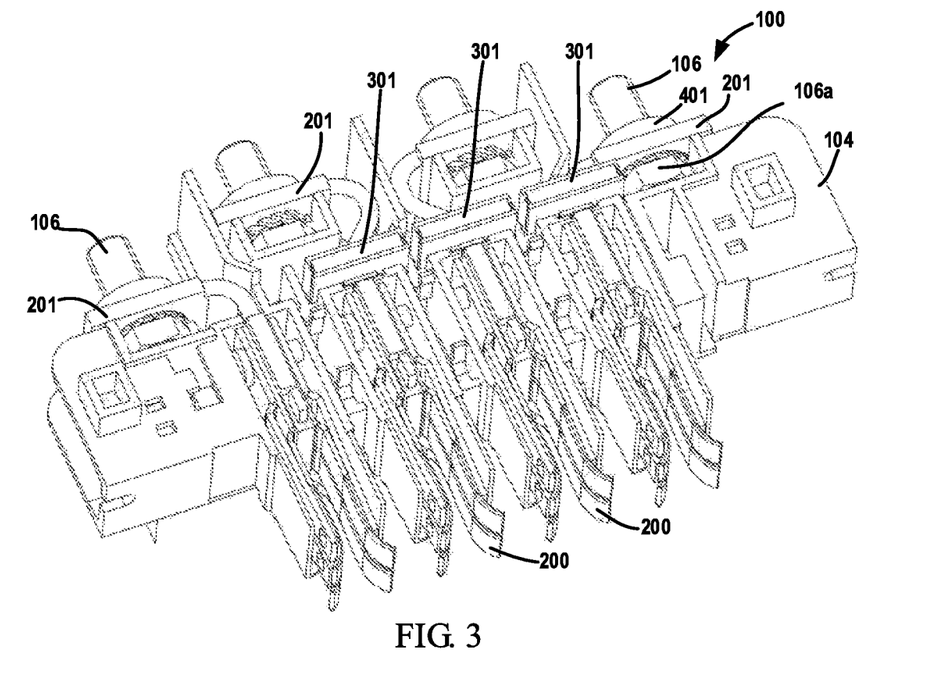
FIG. 3 schematically illustrates a perspective view of a primary plugin in accordance with embodiments of the present disclosure.
Figure 4:
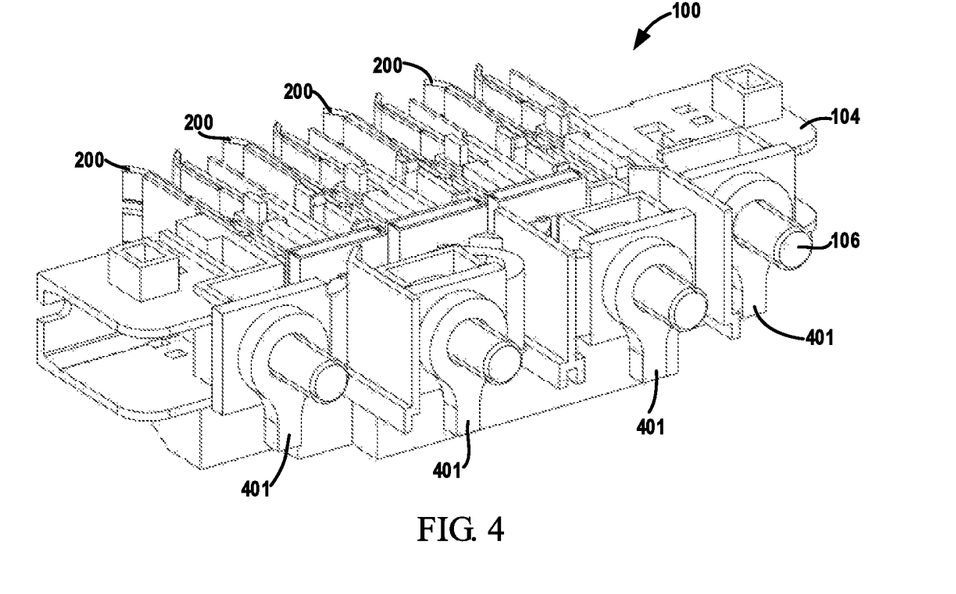
FIG. 4 schematically illustrates a perspective view of a primary plugin in accordance with embodiments of the present disclosure.

In the embodiment shown in FIG. 3, it is to be clearly observed that another type of sensor in use is a current sensor 301. The current sensor 301 is used to measure, for example, currents of electrical devices in the power distribution systems.

The measurements of the current parameters measured by the current sensor 301 can be transmitted to the data processing unit 101. The data processing unit 101 then performs data processing for the received measurement results of current parameters, and subsequently uploads the processed measurements to the gateway in a wired or wireless manner. The measurements also can be further uploaded into local management software or cloud storage, e.g., for monitoring and management over the power distribution systems.

The measurements of corresponding power can be conveniently obtained through the acquired measurements of voltages and currents of electrical devices in the power distribution systems described above. The power measurements can be further transmitted to the data processing unit 101. Then, the power measurements can be transmitted, for example by the data processing unit 101, out of the primary plugin 100 in a wired or wireless manner. For example, the power measurements can be uploaded to the gateway.

In another embodiment, alternatively or additionally, a temperature sensor may be integrated with the primary plugin 100. The temperature sensor is used to measure real-time temperature of the primary plugin 100. Particularly, this type of temperature sensor can be used for monitoring the temperature of the primary plugin 100 in use in real time, for example.

The temperature parameter of the primary plugin 100 measured by the temperature sensor can also be transmitted to the data processing unit 101. The data processing unit performs data processing for the temperature parameter and then uploads the processed measurements to the gateway in a wired or wireless manner. The temperature parameter also can be further uploaded into the local management software or the cloud storage, for example, thus monitoring and management over the power distribution systems.

For example, when a temperature of the primary plugin 100 exceeds a safety threshold, an alarm can be issued to users through cooperating with other linked apparatuses (such as display screen and the like) in the power distribution systems, such that users can adopt measures timely to avoid harms caused by over-temperature of the primary plugin 100.

Materials for fabricating respective composites of the already described primary plugin 100 are not particularly defined. Optional solutions suitable for general or special application purposes also fall within the protection scope of the present disclosure.

Figure 7:
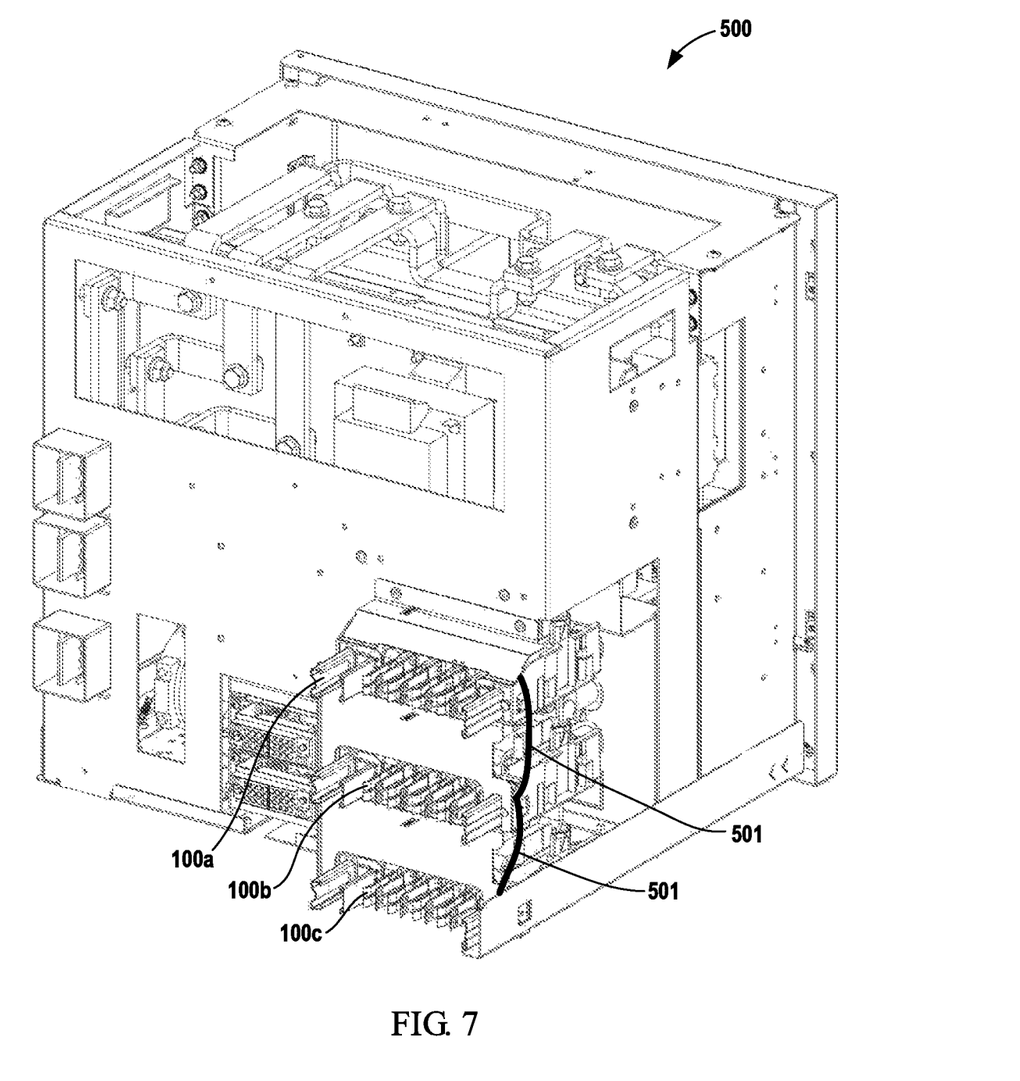
FIG. 7 schematically illustrates a perspective view of a drawer containing three primary plugins in accordance with embodiments of the present disclosure.

In some embodiments, a drawer 500 for use in a distribution panel of a power distribution system is provided. The drawer may include at least one primary plugin 100 described above. FIG. 7 schematically illustrates an example of the drawer 500. The drawer 500 is configured to include three primary plugins 100, i.e., one master plugin 100a and two secondary plugins 100b and 100c. Each primary plugin can be connected, in any suitable manners, to corresponding structures of the drawer 500. The stable connection between the primary plugin 100 and the drawer 500 can be additionally ensured by means of other suitable structures or manners.

Here, the number of primary plugins 100 in the drawer is an example. The number of the plugins 100 may be one, two or more.

In the embodiment shown in FIG. 7, three primary plugins 100a, 100b and 100c may be arranged in such a way that one plugin is superimposed above another plugin. The data processing units 101 of primary plugins are coupled with each other via a wire cable 501. Then, the master plugin 100a can supply power for the two secondary plugins 100b and 100c, ensuring data transmission between the three plugs.

For the three primary plugins 100a, 100b and 100c shown in FIG. 7, composites and configurations (e.g., size) of each primary plugin are basically identical. For example, all of the three primary plugins may include respective composites described with reference to FIGS. 1 to 6. Appropriate adjustments may also be made without affecting specific functions of each primary plugin.

The data processing unit 101 of the master plugin 100a is used for measuring, receiving and processing one or more electrical parameters which are measured by the measuring unit of the master plugin 100a and one or more electrical parameters which are measured by the measuring units of the other two secondary plugins 100b and 100c. The processed electrical parameters can be uploaded to the gateway and then further uploaded into the local management software or cloud storage, e.g., for monitoring and management over the power distribution systems.

In other words, the three primary plugins 100a, 100b and 100c can separately measure user-concerned electrical parameters. The data processing units 101 of the secondary plugins 100b and 100c are used for receiving the measurements of the measured electrical parameters and transmitting, to the data processing unit 101 of the master plugin 100a, for example, in a wired or wireless way. Finally, the data processing unit 101 of the master plugin 100a can perform data processing for the measured or received measurements of electrical parameters of the three primary plugins, uploads the processed measurements to the gateway in a wired or wireless manner, and further uploads the processed measurements to the local management software or cloud storage, for monitoring and management over the power distribution systems.

In an example of measuring and processing the current parameters, two secondary plugins 100b and 100c can transmit the respectively measured current data to the master plugin 100a. The master plugin can then stack the received current data, which are measured by two secondary plugins 100b and 100c, into one result (parallel current), and subsequently performs the transmission.

This is also suitable for processing other types of electrical parameters. Specifically, when a plurality of electrical parameters (current, voltage, vibration and/or humidity of primary plugin and the like) are measured simultaneously, the master plugin 100a can aggregate and process all measurements, transmits the processed measurements to the gateway (in wired or wireless way), and further uploads them to the local management software or cloud storage, for monitoring and management over the power distribution systems.

It is to be understood that the two secondary plugins 100b and 100c, listed in the above embodiment or any other feasible embodiments, may include more or less secondary plugins (e.g., one, three or four plugins), and that the respective functions of the primary plugin and the secondary plugin are completely identical. Only when the primary and secondary plugins are coupled with each other within the same drawer, should the master plugin take charge of processing and transmitting the measurements which are measured by all plugins and transmitted eventually to the master plugin. In other words, when these primary plugins are not coupled within the same drawer, these plugins may be identical in the terms of function and configuration. Instead, every plugin has the following function: measuring the electrical parameters, collecting, processing and transmitting the measurements associated with the electrical parameters.

Furthermore, the power supply required by the secondary plugins 100b and 100c may all come from the master plugin 100a. Such configuration also applies to the drawer 500 containing two or more primary plugins.

In some embodiments, a distribution panel for a power distribution system is provided. The distribution panel may include the drawer 500 comprising the above described primary plugin 100. Thus, the distribution panel in these embodiments also has many merits and benefits brought by the integrated primary plugin 100.

Referring to FIGS. 5a and 5b again, two opposite distal ends of the first end 202 of the socket assembly 200 may extend away from each other and curl slightly outwards. Two side arms 204 of the socket assembly 200 may taper gradually along a direction R from the second end 201 to the first end 202, for example. As exemplarily shown, a configuration with wide top and narrow bottom along direction R is present. Therefore, a clamping force can be generated by means of the two side arms 204 so as to couple the primary plugin 100 with the distribution panel via the socket assembly 200.

For example, when it is required to mount the drawer 500 equipped with the primary plugin 100 into the distribution panel, an opening formed between the two side arms 204 of the socket assembly 200 is adapted to a matching structure on the distribution panel. Then, the primary plugin 100 can be coupled with the distribution panel via the socket assembly 200, thereby implementing functions like measuring corresponding electrical parameters.

It is to be understood that the design of integrating functions proposed by embodiments of the present disclosure, such as electrical parameter measuring, processing and transmitting for the primary plugin in the drawer of the distribution panel, involve an inventive concept. Descriptions of the primary plugin, the drawer and some composites of the distribution panel are omitted, because they are conventional designs or known facts in the art.

It is to be appreciated that description of the above embodiments is merely to enable those skilled in the art to better understand and further implement the present disclosure and is not intended for limiting the scope disclosed herein in any manner. It should be noted similar or same reference signs can be used in the drawings where feasible, and similar or same reference signs can represent similar or same functions. Those skilled in the art will easily recognize that alternative embodiments of the structure and method explained in the text can be adopted without deviating from the principles of the present disclosure described herein.

As used herein, the term "includes" and its variants are to be read as open terms that mean "includes, but is not limited to." The term "based on" is to be read as "based at least in part on." The term "one embodiment" is to be read as "at least one embodiment." The term "a further embodiment" is to be read as "at least one further embodiment."

References to any prior art in the description neither are nor should be interpreted as acknowledging or suggesting that the prior art constitutes the common knowledge.

It should be understood that the attached claims are temporary claims only and are examples of possible claims with no intentions of confining the scope of the claims to any future patent applications based on the present application with. The example claims may be added or deleted with other contents in the future to further define or re-define the present disclosure.

The invention claimed is:

1. A primary plugin for a power distribution system, comprising:
   a body;
   a socket assembly mounted on the body;
   a measuring unit mounted around the socket assembly and configured to measure electrical parameters in the power distribution system;
   a data processing unit mounted on the body and coupled to the measuring unit, the data processing unit being adapted to receive and process the electrical parameters measured by the measuring unit and to upload the processed electrical parameters to a gateway; and
   a shroud arranged above the data processing unit to enclose the data processing unit, wherein a mounting hole is formed in the shroud, and wherein the mounting hole cooperates with one of mounting structures formed on the body to detachably mount the shroud on the body.

2. The primary plugin of claim 1, wherein the measuring unit is a current sensor arranged on the socket assembly for measuring currents of electrical devices in the power distribution system.

3. The primary plugin of claim 1, wherein the measuring unit is selected from a group consisting of: a voltage measuring device for measuring voltages of electrical devices in the power distribution system; a sensor for measuring currents of the electrical devices; a sensor for measuring a temperature of the primary plugin; a sensor for measuring vibration of an environment where the electrical devices are located; and a sensor for measuring humidity of the environment where the electrical devices are located.

4. The primary plugin of claim 3, wherein the voltage measuring device includes a stud formed on one side of the body and protruded outward and a wiring terminal arranged around the stud, wherein the stud is coupled to the socket assembly via a nut.

5. A drawer for a power distribution system, comprising the primary plugin according to claim 1.

6. The drawer of claim 5, comprising two or three primary plugins, wherein one primary plugin is a master plugin and the rest primary plugins are secondary plugins, wherein the master plugin and the secondary plugins are arranged in the drawer by superimposing one another, and wherein the data processing units of the two or three primary plugins are coupled to each other.

7. The drawer of claim 6, wherein the data processing units of the two or three primary plugins are coupled to each other via a cable.

8. A distribution panel for a power distribution system, comprising the drawer according to claim 5.

9. The distribution panel of claim 8, wherein a first end of the socket assembly is of a forked structure, two opposite distal ends of the forked structure extend away from each other, and two opposite side arms of the socket assembly are tapered along a direction from a second end to the first end of the socket assembly, thereby forming a clamping force that couples the primary plugin to the distribution panel via the socket assembly.

* * * * *